United States Patent
Muench et al.

(10) Patent No.: US 10,425,088 B2
(45) Date of Patent: Sep. 24, 2019

(54) PROGRAMABLE IMMEDIATE FREQUENCY CHANGE FOR DIGITAL PHASE LOCKED LOOP

(71) Applicant: International Business Machines Corporation, Armonk, NY (US)

(72) Inventors: Paul D. Muench, Poughkeepsie, NY (US); Pawel Owczarczyk, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 78 days.

(21) Appl. No.: 15/409,894

(22) Filed: Jan. 19, 2017

(65) Prior Publication Data

US 2018/0205385 A1    Jul. 19, 2018

(51) Int. Cl.
*H03L 7/099*    (2006.01)
*G06F 1/32*     (2019.01)
*G06F 1/30*     (2006.01)
*G06F 1/3287*   (2019.01)
*H03L 7/08*     (2006.01)
*G06F 1/08*     (2006.01)

(52) U.S. Cl.
CPC ............ *H03L 7/0991* (2013.01); *G06F 1/08* (2013.01); *G06F 1/305* (2013.01); *G06F 1/3287* (2013.01); *H03L 7/0802* (2013.01); *H03L 2207/50* (2013.01)

(58) Field of Classification Search
CPC ....... H03L 7/0991; G06F 1/305; G06F 1/3287
See application file for complete search history.

(56) References Cited

U.S. PATENT DOCUMENTS

| | | | |
|---|---|---|---|
| 5,999,039 A | 12/1999 | Holst et al. | |
| 6,198,353 B1 * | 3/2001 | Janesch | H03L 7/085 331/16 |
| 6,809,606 B2 | 10/2004 | Wong et al. | |
| 7,409,568 B2 | 8/2008 | Tam et al. | |
| 8,536,916 B1 * | 9/2013 | van Engelen | H03L 7/099 327/150 |
| 2012/0187991 A1 | 7/2012 | Sathe et al. | |
| 2015/0214964 A1 | 7/2015 | Huynh et al. | |

FOREIGN PATENT DOCUMENTS

GB      2525864 A    11/2015

* cited by examiner

*Primary Examiner* — Stefan Stoynov
(74) *Attorney, Agent, or Firm* — Cantor Colburn LLP; Margaret McNamara

(57) ABSTRACT

According to one or more embodiments, a method implemented by a digital phase-locked loop of a processor is provided. The method includes turning off, by the digital phase-locked loop, a percentage of active devices of a digitally controlled oscillator to implement a fast path within the digital phase-locked loop. The method also includes reducing, by the digital phase-locked loop, a multiplier of a frequency filter setting to implement a control path within the digital phase-locked loop.

8 Claims, 3 Drawing Sheets

PROGRAMABLE IMMEDIATE FREQUENCY CHANGE FOR DIGITAL PHASE LOCKED LOOP

BACKGROUND

The disclosure relates generally to the technique for quickly reducing frequency of digital phase locked loop by a small percentage and locking to the reduced frequency.

In general, contemporary processors have to operate at increased voltage to allow for system voltage droops. There is a need for a mechanism for slowing a processor frequency that is faster than a voltage droop to reduce the extra voltage guardband and to protect against other conditions like overheating.

SUMMARY

According to one or more embodiments, a method implemented by a digital phase-locked loop of a processor is provided. The method comprises turning off, by the digital phase-locked loop, a percentage of active devices of a digitally controlled oscillator to implement a fast path within the digital phase-locked loop; and reducing, by the digital phase-locked loop, a multiplier of a frequency filter setting to implement a control path within the digital phase-locked loop.

According to one or more embodiments, the above method can be implemented as a digital phase-locked loop and/or a processor.

BRIEF DESCRIPTION OF THE SEVERAL VIEWS OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

Figure 1:
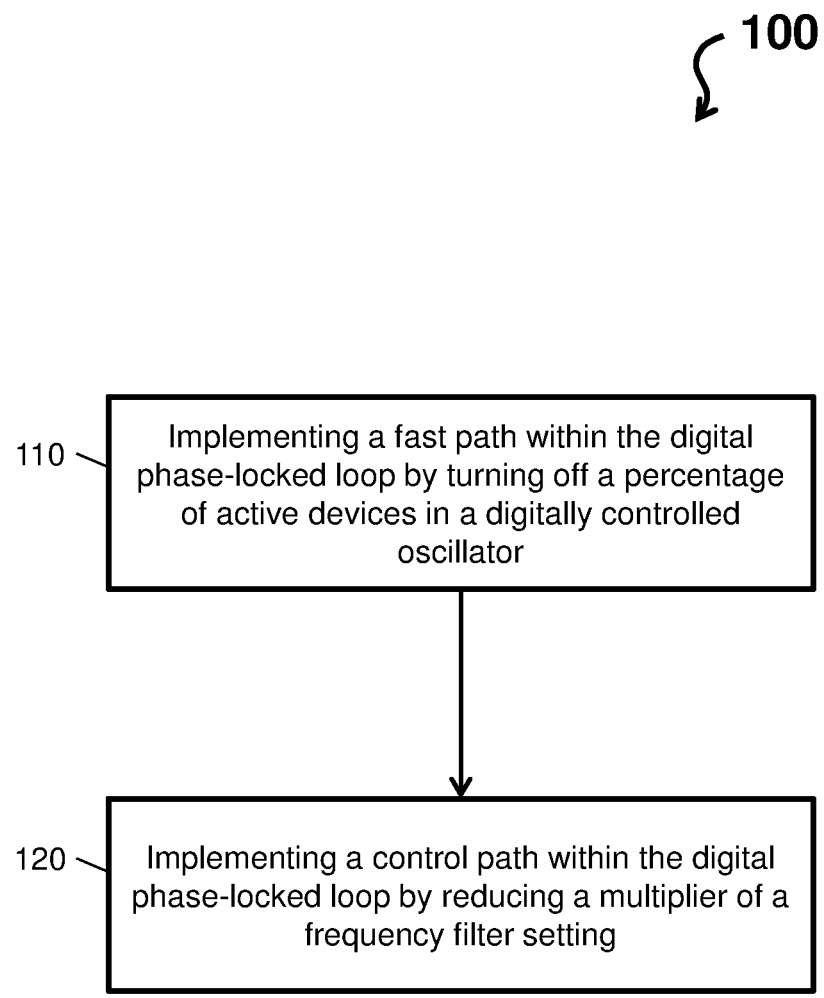
FIG. 1 depicts a process flow of a digital phase-locked loop in accordance with one or more embodiments.

A digital phase-locked loop (DPLL) monitors input codes to determine if a frequency adjustment is required in view of a reduction request. The DPLL performs two actions upon a reduction request. For example, FIG. 1 depicts a process flow 100 of a DPLL in accordance with one or more embodiments.

The process flow 100 comprises a first action, at block 110, where the DPLL executes a fast path by turning off a percentage of active devices in a digitally controlled oscillator (DCO). In a non-limiting embodiment, the DPLL jumps to a lower frequency by instantly turning off a percentage of active devices in the DCO using the Equation 1, where M is the percent response:

$$\text{reduced\_DCO\_setting} = \text{nominal\_DCO\_setting} * (1-M)$$

Equation 1:

Note the jump accuracy can be limited by the active devices of the DCO.

The process flow 100 comprises a second action, at block 120, where the DPLL executes a control path by reducing a multiplier of a frequency filter setting. In a non-limiting embodiment, the multiplier of the frequency filter can be reduced by the percent amount to more accurately lock to the new target until the reduction request ends.

To quickly recover frequency as the reduction request subsides, the DPLL, at block 110, can gradually add devices back to the DCO every reference clock cycle or instantly add the devices (in both cases less than the original amount is added to prevent overshoot).

When a reduction request is no longer indicated the nominal frequency filter multiplier is restored, at block 120, allowing normal dynamics of the DPLL to add the remaining devices to the DCO as it naturally slews and locks back to the original target.

Figure 2:
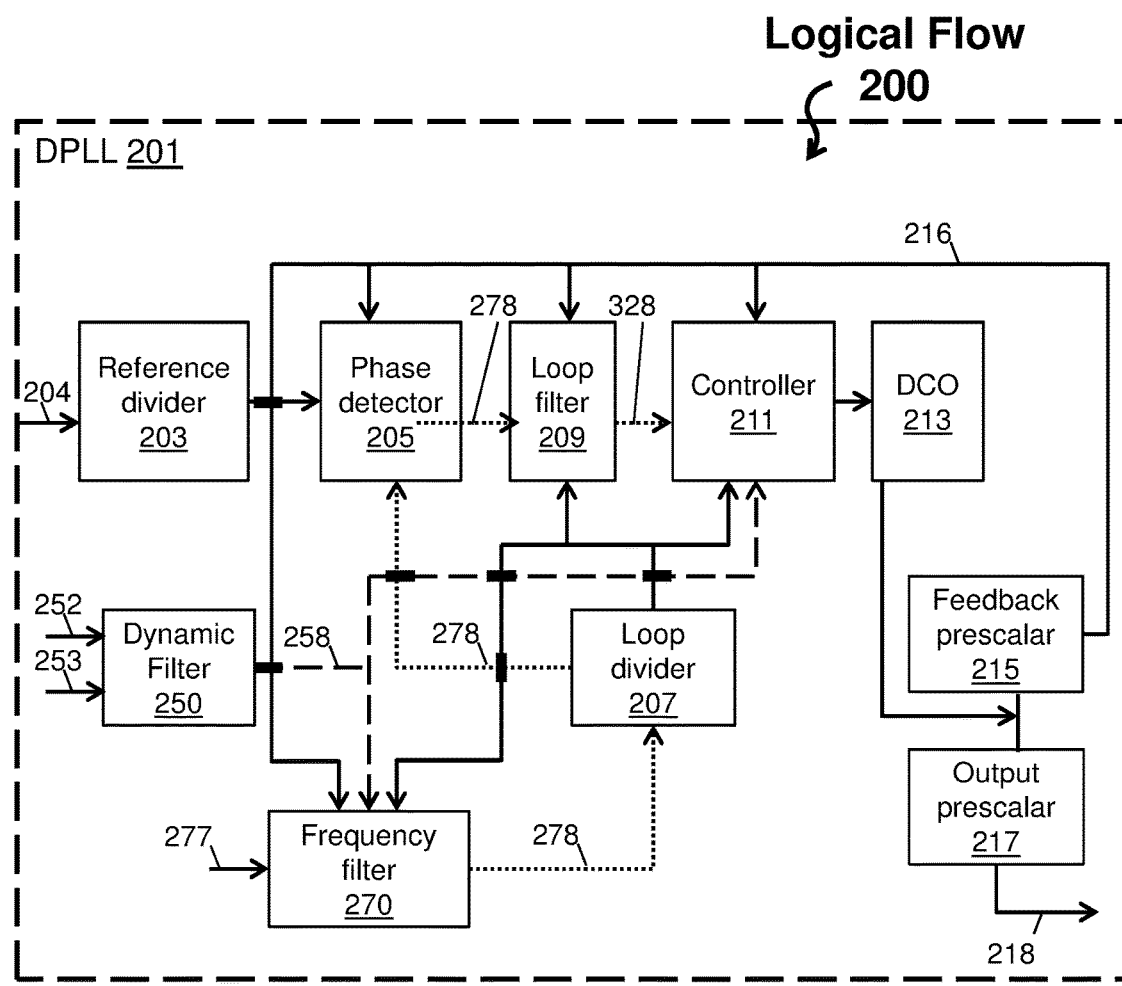
FIG. 2 depicts a logical flow of digital phase-locked loop in accordance with one or more embodiments.

Turning now to FIG. 2, a logical flow 200 of the DPLL 201 in accordance with one or more embodiments. The logical flow 200 depicts example operations of the DPLL 201 and the components therein. The DPLL 201 comprises a reference divider 203 that receives a reference clock 204. The DPLL 201 comprises a phase detector 205, a loop divider 207, a loop filter 209, a controller 211 (e.g., a row a column controller), and a DCO 213. The DPLL 201 comprises a feedback prescalar 215, which outputs a feedback signal 216 (e.g., 'mclk' signal), and an output prescalar 217, which outputs a clock signal 218 (e.g., 'clkout' signal).

The DPLL 201 comprises a dynamic filter 250 that receives a control signal 252 and a data signal 253. The control signal 252 can be a control bit (e.g., 'enable_jump_protection' signal) that switches the clock reduction on and off. The data signals 253 can be a signal received from the system. This signal can comprise a combination of outputs of sensors indicating performance loss, example a voltage droop sensor. In a non-limiting embodiment, the signal can be a four-bit output code indicating the reduction request, allowing for multiple jumps depending on level of performance loss. Thus, when the control signal is enabled and when the four-bit output code indicates the reduction request, the fast path 258 can be implemented by the dynamic filter 250.

The DPLL 201 comprises a frequency filter 270 that receives a frequency signal 277. The frequency signal 277 can comprise an integer part and fractional part (e.g., 'mult_intg and mult_frac' signal) that is used to multiply the reference clock 204 and execute a control path 278. Frequency filter 270 can also receive input from the fast path 258, which forces multiplier reduction.

Note that, in view of the above, the DPLL 201 can also utilize a small frequency reduction to reduce a margin, by extending cycle time which allows a processor to continue functioning properly with a voltage droop condition.

Figure 3:
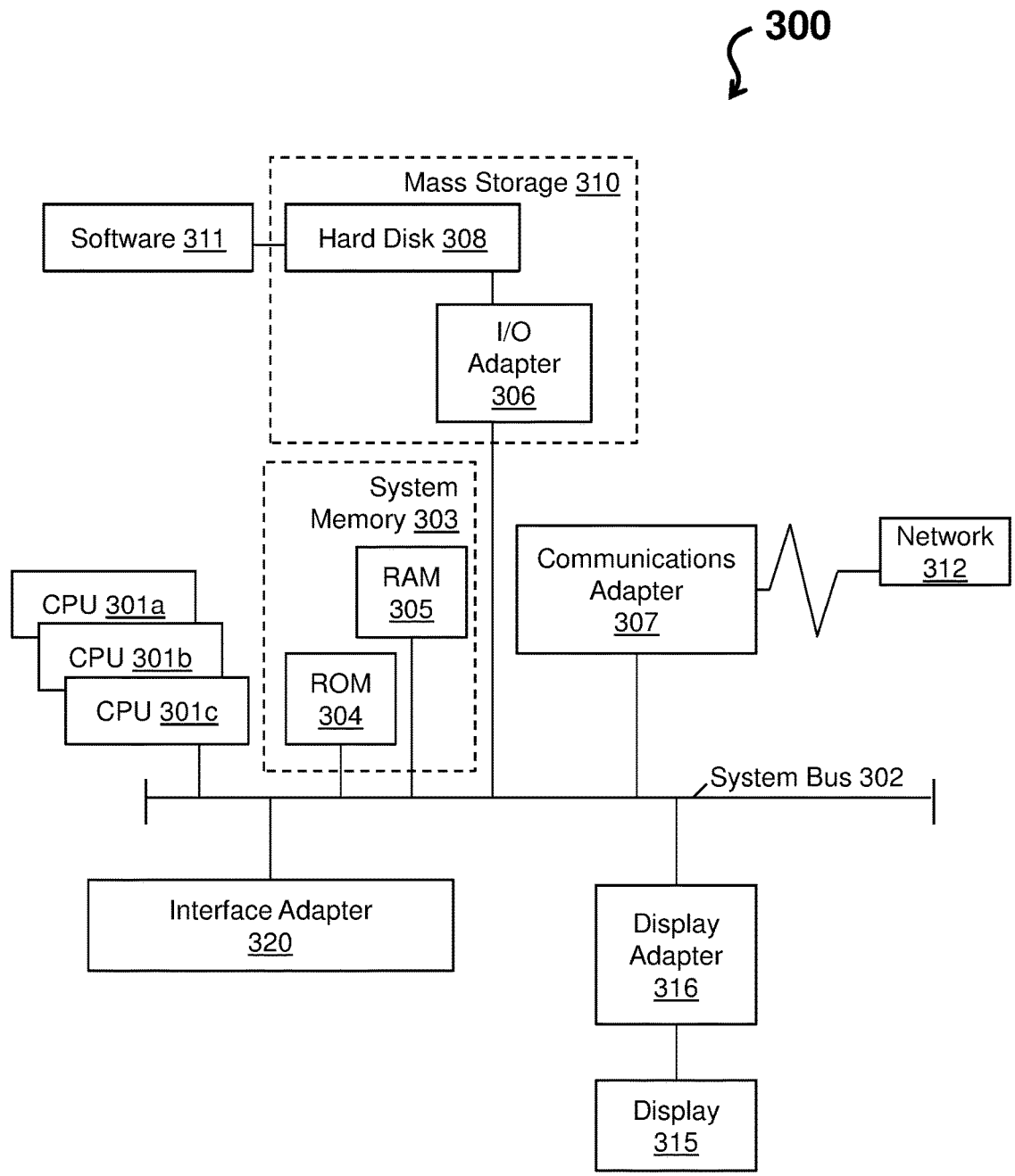
FIG. 3 depicts a processing system in accordance with one or more embodiments.

FIG. 3 depicts an example of a system 300 in accordance with one or more embodiments. The system 300 has one or more central processing units (CPU(s)) 301a, 301b, 301c, etc. (collectively or generically referred to as processor(s) 301). The processors 301, also referred to as processing circuits, are coupled via a system bus 302 to system memory 303 and various other components. The system memory 303 can include a read only memory (ROM) 304 and a random access memory (RAM) 305. The ROM 304 is coupled to the system bus 302 and may include a basic input/output system (BIOS), which controls certain basic functions of the system 300. The RAM is read-write memory coupled to the system bus 302 for use by the processors 301.

FIG. 3 further depicts an input/output (I/O) adapter 306 and a communications adapter 307 coupled to the system bus 302. The I/O adapter 306 may be a small computer system interface (SCSI) adapter that communicates with a hard disk 308 and/or any other similar component. The I/O adapter 306 and the hard disk 308 are collectively referred to herein as a mass storage 310. A software 311 for execution on the system 300 may be stored in the mass storage 310. The mass storage 310 is an example of a tangible storage medium readable by the processors 301, where the software 311 is stored as instructions for execution by the processors 301 to cause the system 300 to operate, such as is described herein with reference to FIGS. 1-2. Examples of computer program product and the execution of such instruction is discussed herein in more detail. Referring again to FIG. 3, an a communications adapter 307 interconnects the system bus 302 with a network 312, which may be an outside network, enabling the system 300 to communicate with other such systems. A display (e.g., screen, a display monitor) 315 is connected to the system bus 302 by a display adapter 316, which may include a graphics controller to improve the performance of graphics intensive applications and a video controller. In one embodiment, the adapters 306, 307, and 316 may be connected to one or more I/O buses that are connected to the system bus 302 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to the system bus 302 via an interface adapter 320 and the display adapter 316. A keyboard, a mouse, a speaker, etc. can be interconnected to the system bus 302 via the interface adapter 320, which may include, for example, a Super I/O chip integrating multiple device adapters into a single integrated circuit.

Thus, as configured in FIG. 3, the system 300 includes processing capability in the form of the processors 301, and, storage capability including the system memory 303 and the mass storage 310, input means such as the keyboard and the mouse, and output capability including the speaker and the display 315. In one embodiment, a portion of the system memory 303 and the mass storage 310 collectively store an operating system, such as the z/OS or AIX operating system from IBM Corporation, to coordinate the functions of the various components shown in FIG. 3.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor comprising a digital phase-locked loop, the digital phase-locked loop comprising:
    a reference divider;
    a phase detector;
    a loop divider;
    a loop filter;
    a controller;
    a digitally controlled oscillator;
    a feedback prescalar;
    an output prescalar; and
    a dynamic filter, wherein the dynamic filter receives a control signal and a data signal, wherein the control signal comprises a control bit that switches a clock reduction on and off, and wherein the data signal comprises a four-bit output code indicating a reduction request; and
    a frequency filter.

2. The processor of claim 1, wherein the reference divider receives a reference clock.

3. The processor of claim 1, wherein the feedback prescalar outputs a feedback signal.

4. The processor of claim 1, wherein the output prescalar outputs a clock signal.

5. The processor of claim 1, wherein a fast path within the digital phase-locked loop is enabled when the control signal is enabled and when the four-bit output code indicates the reduction request.

6. The processor of claim 1, wherein the frequency filter receives a frequency signal comprising an integer part and a fractional part.

7. The processor of claim 6, wherein the frequency signal enables a control path within the digital phase-locked loop.

8. The processor of claim 6, wherein the frequency filter receives an input from a fast path.

\* \* \* \* \*